Figure 1:
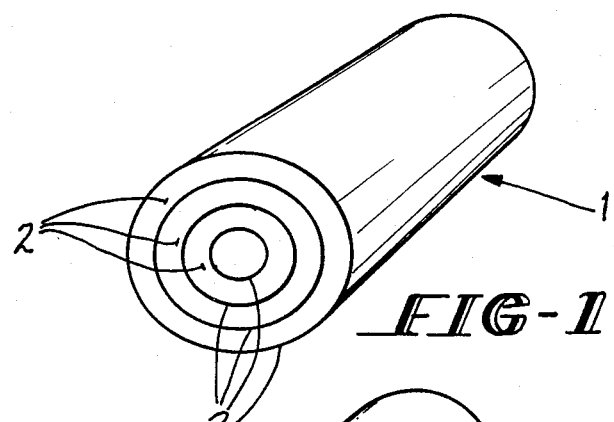

United States Patent [19]

Mier

[11] Patent Number: 4,982,497

[45] Date of Patent: Jan. 8, 1991

[54] PROCESS FOR MANUFACTURE OF A SUPERCONDUCTOR

[75] Inventor: Gerhard Mier, Singen, Fed. Rep. of Germany

[73] Assignee: Swiss Aluminium Ltd., Chippis, Switzerland

[21] Appl. No.: 295,249

[22] PCT Filed: Mar. 31, 1988

[86] PCT No.: PCT/CH88/00071

§ 371 Date: Dec. 5, 1988

§ 102(e) Date: Dec. 5, 1988

[87] PCT Pub. No.: WO88/08208

PCT Pub. Date: Oct. 20, 1988

[30] Foreign Application Priority Data

Apr. 11, 1987 [DE] Fed. Rep. of Germany ....... 3712320

[51] Int. Cl.$^5$ .................................................. H01L 39/24
[52] U.S. Cl. ...................................... 29/599; 428/614; 428/930
[58] Field of Search ................. 29/599; 428/614, 651, 428/930; 174/15.5, 125.1; 427/62

[56] References Cited

U.S. PATENT DOCUMENTS

| H39 | 3/1986 | Gubser et al. ............... 427/62 X |
|---|---|---|
| 3,158,792 | 11/1964 | Swartz et al. ............... 428/614 X |
| 3,469,952 | 9/1969 | Baker ............................ 428/614 |
| 3,576,670 | 4/1971 | Hammond ................ 427/62 X |
| 4,285,120 | 8/1981 | Nomura et al. ................ 29/599 |

FOREIGN PATENT DOCUMENTS

| 0119553 | 9/1984 | European Pat. Off. . |
|---|---|---|
| 2525980 | 10/1976 | Fed. Rep. of Germany . |
| 3245903 | 6/1984 | Fed. Rep. of Germany . |

Primary Examiner—Joseph M. Gorski
Attorney, Agent, or Firm—Bachman & LaPointe

[57] ABSTRACT

An extruded superconductor (1) comprises a conductor core composed of thin metal filaments, for example of niobium-titanium or niobium-tin, and a high-purity aluminium sheath (2) which acts as a stabilizer. A marked reduction in the electrical conductivity perpendicular to the longitudinal axis of the conductor is achieved by means of structures (3) in the form of cross-sectionally distributed layers, ribbon-like strips or closely aligned longitudinal single filaments or fibres or bundles of fibres made of a material of low conductivity embedded coaxially in the aluminium sheath. The layers of low conductivity material embedded coaxially in the aluminium sheath may be closed concentric circular sheaths surrounding the conductor core, at a distance from the core and from one another or ribbon-like strips made of the low conductivity material arranged in a star-shaped configuration about the conductor core.

8 Claims, 2 Drawing Sheets

PROCESS FOR MANUFACTURE OF A SUPERCONDUCTOR

The invention relates to a process for manufacture of a superconductor from a niobium-titanium-tin (sic) or similar filament as conductor core and a sheath surrounding the latter as a stabilizer, which is extruded through the molding cross-section of a die from an aluminum billet which is preferably composed of high purity aluminum.

Superconductivity describes the physical effect that the electrical resistance of certain metals can become zero at temperatures close to absolute zero ($-273°$ C.).

Superconductors are used in metrology, for example for measuring weak magnetic fields and currents and also in computer engineering for superfast stores and logic units. More significant are the fields of application for producing strong magnetic fields, for example for large magnets for nuclear power stations, magnetic levitation railways, particle accelerators, and furthermore for superconducting coils, superconducting cables for loss-free energy transmission, superconducting generators for generating energy or superconducting transformers and energy stores.

Thin filaments (30 to 50 $\mu$m diam.) of niobium-titanium or niobium-tin which are normally embedded in a copper wire serve as superconductors. Depending on the application, this wire is sheathed individually or stranded to form a bundle with high purity aluminum which serves as a stabilizer.

Interference in the magnetic field may interrupt the superconductivity for a short time. The stabilizer of high purity aluminum (purity 9.99 (sic) to 99.999%) then has to take over the current for a short time. Aluminum is better suited for this purpose than copper because it has only about 10% of the electrical resistance of copper at 4.2 K.

In the course of the years, increasingly stronger magnetic fields, for example for particle acceleration in nuclear research, were employed. The harmonics, i.e. the variations with time, of these magnetic fields produce eddy currents in the stabilizer of high purity aluminum which generate heat in an undesirable manner and interrupt the superconductivity of the niobium-titanium or niobium-tin filaments. Although it was hitherto possible in the case of fairly low magnetic fields to compensate for the heat generation of the eddy currents by more intense helium cooling, this is no longer possible for very intense magnetic fields.

A process of the type mentioned in the introduction is known from German Patent Specification No. 3,245,903. In that case a conductor core of niobium-titanium or $Nb_3Sn$ is present which is embedded in a primary stabilizer of high purity copper or high purity aluminum The primary stabilizer is directly surrounded by a secondary stabilizer which is composed of super pure aluminum. Cooling channels through which liquid or boiling helium under pressure is passed during operation are provided on both sides of the conductor core in the extruded profile body of the secondary stabilizer.

The object therefore exists of improving a process of the type mentioned in the introduction for manufacture of a superconductor so that the eddy currents produced in the aluminum stabilizer are kept so low even in the region of very intense magnetic fields that the heat generated by the eddy currents can be removed fast enough, possibly by the helium cooling, but at any rate is so low that the superconductivity is not impaired.

In achieving this object, the invention proceeds from the knowledge that it is necessary to reduce the eddy currents produced in the aluminum sheath employed as stabilizer.

This object is achieved by employing an aluminum billet with structures, extending coaxially to its longitudinal axis and composed of low conductivity material, in the form of cross-sectionally distributed layers, ribbon-like strips or closely spaced longitudinal individual filaments or individual fibers or fiber bundles and extruding it to form a superconductor with markedly reduced electrical conductivity perpendicular to the longitudinal axis of the conductor as a result of the coaxially extending structures embedded in the aluminum sheath and composed of the low conductivity material.

At the same time a stabilized superconductor in which, to achieve a metallically intimate joint between the individual billet constituents, the superconducting filaments are formed with the aid of a hot treatment by diffusing a material component, contained in the matrix and capable of diffusion, into a material component arranged filament-like in the interior of the conductor, is known per se from German Offenlegungsschrift No. 2,525,980.

This known superconductor is assembled in a layer fashion in cross-section from the inside to the outside from material which is partly of high conductivity and partly of high resistance. The conductor core is composed of many niobium rods which are individually surrounded by a high resistance layer to reduce the eddy current losses. These sheathed niobium rods are surrounded by bronze tubes or embedded in a bronze block. This is followed by a layer of copper rods as a sheath and then by a casing of a high resistance alloy and a diffusion barrier which surrounds the copper rods as a sheath.

Provided as an outermost layer is a hollow cylinder of low conductivity material, which may also be of brass. Although the entire arrangement of this known superconductor may attenuate eddy currents through arrangement of a low conductivity material, it can only be manufactured with very high costs and under no circumstances by the extrusion method.

German Offenlegungsschrift No. 2,525,980 briefly mentions, in addition, another separate prior art according to which the superconductor cores are surrounded by a bronze matrix which is in turn surrounded by a diffusion barrier and the latter by electrically highly conductive copper or aluminum, such an arrangement being described as unsuitable.

Particular further developments of the invention are characterized in the subclaims.

The layers of the low conductivity material embedded in the aluminum sheath and extending coaxially may be formed as closed concentric circular sheath layers surrounding the conductor core at a distance and exhibiting a distance from each other, and additionally or alternatively, the ribbon-like strips of low conductivity material may be arranged in a star-shaped configuration with respect to the conductor core.

A modified formation of the stabilizer according to the invention may also be perceived in that the longitudinal individual filaments or individual fibers or fiber bundles embedded in the aluminum sheath with a close cross-sectional distribution are composed of glass fibers, oxide fibers or another high resistance material.

At the same time, according to a further feature, the strips, individual filaments or individual fibers or fiber bundles of the low conductivity material may have a small cross-section in the coaxially extending direction but a substantially larger area projection in the directions extruding perpendicular to the longitudinal extension.

The principal advantage of the superconductor extruded by the process according to the invention over the prior art is the anisotropy of the electrical conductivity of the aluminum stabilizer, i.e. the different conductivity parallel and perpendicular to the extrusion direction respectively. This fulfills the object of the invention of allowing the electrical current to pass unimpeded in the longitudinal direction, but on the other hand, the eddy currents perpendicular to the extrusion direction are markedly reduced by a reduced conductivity.

The conductor core is sheathed by the extrusion process in which a solid or hollow billet of superpure aluminum received in the container of the extrusion press is extruded through a die and the aluminum billet is provided with structures, extending coaxially to its longitudinal axis and composed of a low conductivity material, in the form of cross-sectionally distributed layers, ribbon-like strips or closely spaced longitudinal individual filaments or individual fibers or fiber bundles.

At the same time, in a further development, a solid or hollow billet of circular, oval or polygonal cross-section may be manufactured starting from a circularly, ovally or polygonally cylindrical solid or hollow core piece by alternately sequential spraying on of thick layers of superpure aluminum and thin layers of low conductivity material. The spraying on may preferably be carried out with a rotating billet.

As a modification of this, a circular, oval or polygonal solid or hollow billet of superpure aluminum may be manufactured by the casting method; and glass fibers, oxide fibers or strands or fibers of another high resistance material which extend in length while reducing their cross-section when the billet is extruded may be introduced into the casting mold or the melt.

Furthermore, a further development of the process proposes that, to produce separating joints in the finally extruded sheath strand of the superpure aluminum, the die of the extrusion press is provided with fixed ribs which produce a division of the billet material into individual strands which are again assembled to form a complete strand having the joints on leaving the die. A low conductivity material may then be arranged in the joints.

A particularly advantageous achievement of the object set is that, as mentioned in the introduction, ribbon-like strips of low conductivity material are embedded in the aluminum sheath. For this purpose, the process is proposed to the effect that, on the one hand, the conductor core is sheathed by the extrusion process, a solid or hollow billet of homogeneous superpure aluminum received in the container of the extrusion press is extruded through a die into which ribbon-like strips, fiber bundles or similar longitudinally extended structures of a low conductivity material are introduced into (sic) the sheath of the superpure aluminum being formed through suitably dimensioned channels. In this process, the ribbon-like strips introduced through the die during the extrusion are embedded in a configuration aligned in a star shape with respect to the conductor core. According to a modified process, the sheath may also be manufactured by the extrusion composite process in which the conductor core is first coated with a first sheath layer by pressing in a first pressing process and a thin layer of a low conductivity material is deposited on said sheath layer and a second sheath layer of superpure aluminum is then pressed thereon by extrusion through a subsequent die. Obviously, a further thin layer of the low conductivity material can also be deposited in each case on the second and every further subsequent sheath layer. However, it is envisaged that no further thin layer of the low conductivity material is deposited on the outermost sheath layer of superpure aluminum.

The various procedures according to the invention make it possible, depending on the required physical-technical properties and the conditions of use, to manufacture superconductors in which the eddy currents are suppressed to a large extent and the undesired heating is consequently also restricted to a minimum.

Figure 4:
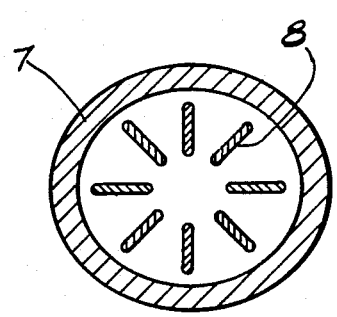
Figure 5:
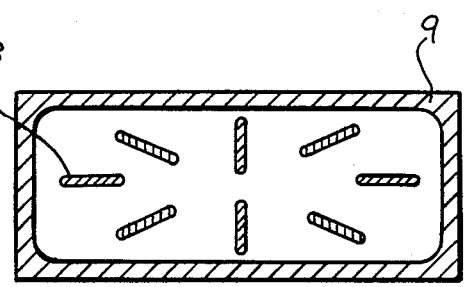
Figure 6:
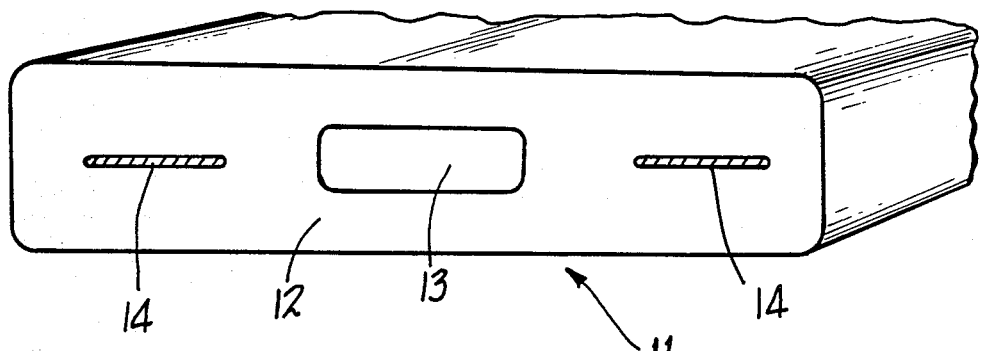
Figure 7:
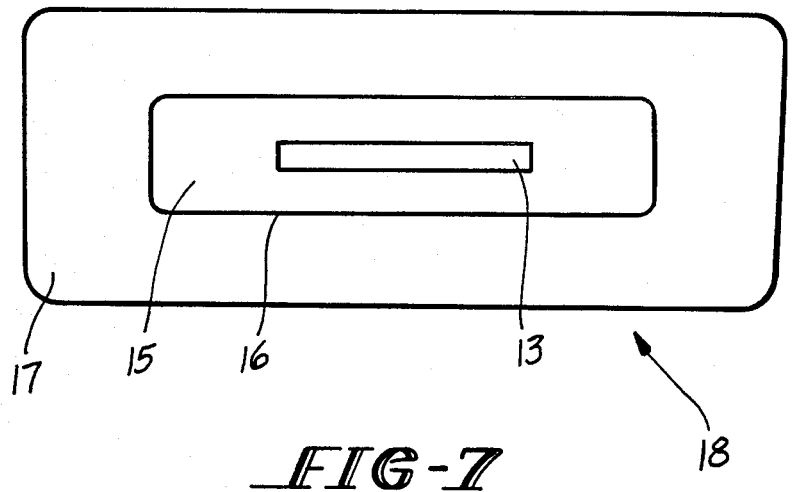

The invention is explained in more detail below with reference to exemplary embodiments. Here FIG. 1 shows an extrusion billet with circular layers of low conductivity material, FIG. 2 shows an extrusion billet with fibrous structures of low conductivity material, FIG. 3 show a cross-section through a fiber according to FIG. 2 of a low conductivity material, FIG. 4 shows an extrusion die for a round container having ribs, FIG. 5 shows an extrusion die for a rectangular container having ribs, FIG. 6 shows an extruded superconductor of rectangular cross-section in another embodiment, FIG. 7 shows another embodiment of an extruded superconductor according to FIG. 6.

The solid extrusion billet 1 of circular cross-section shown in FIG. 1 is composed of superpure aluminum (AL (sic) 99.999). This material is, however, separated by thin circular sheath layers 3 of a low conductivity material into cylindrical roller-shaped individual bodies. The solid extrusion billet 1 is manufactured by alternately sequential spraying on of thick layers 2 of superpure aluminum and thin layers 3 of the low conductivity material.

Figure 2:
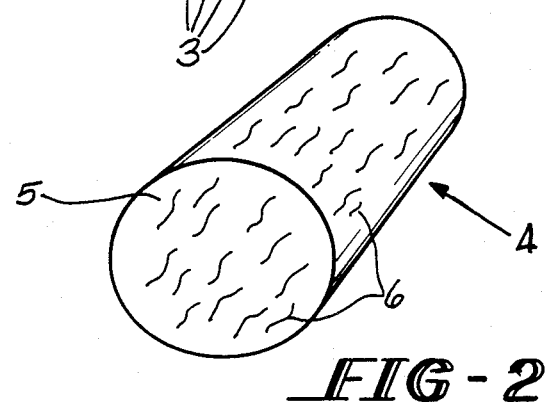

The solid extrusion billet 4 according to FIG. 2 is manufactured by the casting process and is likewise composed of superpure aluminum (AL (sic) 99.999). The low conductivity structures are introduced into the casting mold and/or into the melt in the form of glass or oxide fibers 6.

Figure 3:

FIG. 3 shows, considerably enlarged, a cross-section through a fiber 6 in the pressing direction, as they are embedded in the cast solid extrusion billet 4 according to FIG. 2. In the longitudinal direction, the fibers 6 of a low conductivity material preferably have a round or oval cross-section.

FIG. 4 shows an end view of a round extrusion die 7 which is constructed with ribs 8. In the exemplary embodiment, the ribs are directed centrally inwards towards the center and serve to divide up the billet material into eight individual strands during extrusion. After leaving the die, these individual strands weld again to form a closed complete strand which, however, has welding seams between the eight individual strands.

FIG. 5 furthermore shows the end view of a rectangular extrusion die 9 which also has ribs 8 by which the billet material is divided up into eight individual strands during extrusion. After welding, the welding seams serve to impair the conductivity. Obviously, it is possible to extrude an extrusion billet 5 according to FIG. 2 with embedded fibers 6 in a die 7 according to FIG. 4 so that the measures to reduce the conductivity supplement and intensify each other.

FIG. 6 shows a cross-section through a stabilized superconductor 11 having a core 13 which may be composed of a niobium-titanium or niobium-tin alloy. The stabilizer is formed as rectangular sheath 12 of superpure aluminum in which the tapes 14 of a low-conductivity material are embedded in order to reduce the eddy currents in the aluminum stabilizer.

A modification of the superconductor 18 (sic) according to FIG. 6 is shown in end view in FIG. 7. The conductor core 13 composed of a niobium-titanium or niobium-tin alloy is surrounded by the stabilizer sheath 15 of superpure aluminum. This composite rectangular profile can be manufactured in a first extrusion process. The insulating layer 16 of the low conductivity material is now sprayed onto, or evaporated onto, this sheath 15 of superpure aluminum. Onto this, the outer sheath 17 also of superpure aluminum—or of a similar aluminum alloy—is pressed in a further extrusion process. Here, too, tapes or fibers of a low conductivity material may be embedded in the sheaths 15 and 17.

I claim:

1. A process for the manufacture of a superconductor having a conductor core with a longitudinal axis, and a sheath surrounding said core, said core being formed from an electrically conductive alloy and said sheath being formed from high-purity aluminum with ribbon-like low electrical conductivity materials extending substantially parallel to said longitudinal axis embedded therein, said sheath of high-purity aluminum having said low electrical conductivity materials embedded therein acting as a stabilizer, which process comprises:
   providing an extrusion die having a molding cross-section; and
   extruding said sheath about said core by passing said core through said die and by passing said high purity aluminum and said ribbon-like low conductivity materials through the molding cross-section of said die, thereby forming a stabilizer with markedly reduced electrical conductivity perpendicular to said longitudinal axis of the conductor core as a result of the low electrical conductivity materials embedded in the aluminum sheath, whereby eddy currents are suppressed to a large extent and undesired heating is restricted to a minimum.

2. A process for manufacturing a superconductor in which eddy currents are suppressed to a large extent and undesired heating is restricted to a minimum, said process comprising:
   providing a conductor core formed from an electrically conductive metal alloy and having a longitudinal axis; and
   forming a stabilizing sheath about said core comprising an aluminum component with a longitudinal axis and low electrical conductivity material structures extending substantially parallel to said longitudinal axis of said core, said low electrical conductivity material structures causing a markedly reduced electrical conductivity perpendicular to said longitudinal axis of said core.

3. The process of claim 2 wherein said stabilizing sheath forming step comprises forming at least two spaced apart, concentric circular layers of said low conductivity material about said core.

4. The process of claim 2 wherein said forming step comprises: providing said core in a desired shape; and
   forming an aluminum billet having said low conductivity material structures embedded therein and a desired shape by sequentially spraying on said conductor core a thick layer of superpure aluminum and a thin layer of said low conductivity material.

5. The process of claim 4 further comprising:
   rotating said conductor core during said spraying step.

6. The process of claim 2 wherein said forming step includes extruding at least one of said aluminum component and said low conductivity material structures about said core.

7. The process of claim 2 wherein said conductor core providing step comprises providing a conductor core formed from a niobium alloy.

8. The process of claim 2 further comprising:
   said sheath forming step including forming at least two spaced apart, concentric layers of aluminum material about said core and forming at least one layer of said low electrical conductivity material intermediate said at least two concentric layers.

* * * * *